(12) United States Patent
Stephani et al.

(10) Patent No.: US 6,455,911 B1
(45) Date of Patent: Sep. 24, 2002

(54) SILICON-BASED SEMICONDUCTOR COMPONENT WITH HIGH-EFFICIENCY BARRIER JUNCTION TERMINATION

(75) Inventors: Dietrich Stephani, Bubenreuth; Heinz Mitlehner, Uttenreuth, both of (DE)

(73) Assignee: Siemens Aktiengesellschaft, Munich (DE)

( * ) Notice: Subject to any disclaimer, the term of this patent is extended or adjusted under 35 U.S.C. 154(b) by 907 days.

(21) Appl. No.: 08/702,074

(22) Filed: Aug. 23, 1996

(30) Foreign Application Priority Data

Aug. 25, 1995 (DE) .......................................... 195 31 369

(51) Int. Cl.[7] .......................... H01L 23/58; H01L 29/74; H01L 31/111
(52) U.S. Cl. ........................ 257/493; 257/127; 257/170; 257/409; 257/484; 257/490
(58) Field of Search ................................ 257/127, 170, 257/409, 484, 490, 493

(56) References Cited

U.S. PATENT DOCUMENTS

| | | | |
|---|---|---|---|
| 2,809,165 A | 10/1957 | Jenny ......................... | 252/62.3 |
| 2,827,436 A | 3/1958 | Bemski ....................... | 252/6.3 |
| 4,242,690 A | * 12/1980 | Temple ........................ | 257/493 |
| 4,742,382 A | * 5/1988 | Jaecklin ...................... | 257/170 |
| 5,345,101 A | 9/1994 | Tu .............................. | 257/495 |
| 5,510,634 A | * 4/1996 | Okahe et al. ................ | 257/139 |
| 5,712,502 A | 1/1998 | Mitlehener et al. ......... | 257/341 |

FOREIGN PATENT DOCUMENTS

| | | |
|---|---|---|
| CH | 659 542 A5 | 1/1987 |
| DE | 856 170 | 11/1952 |
| DE | 961 913 | 4/1957 |
| DE | 10 11 082 | 6/1957 |
| DE | 10 37 015 | 8/1958 |
| DE | 11 60 548 | 1/1964 |
| DE | 11 71 536 | 6/1964 |
| DE | 11 78 948 | 10/1964 |
| DE | 11 90 918 | 4/1965 |
| DE | 32 25 991 | 1/1984 |
| FR | 2 480 035 | 10/1981 |
| FR | 2 497 405 | 7/1992 |
| WO | WO 90/01217 A1 | 2/1990 |
| WO | WO 96/03774 | 2/1996 |

OTHER PUBLICATIONS

Moore et al., "Energy Levels in Cobalt Compensated Silicon", J. Applied Phys., vol. 41, No. 13, pp. 5282–5285, Dec. 1970.*
McCombs et al., Impact ionization of deep–impurities (In, Ni, Au) in silicon+, Int. J. Electronics, 1972, vol. 32, No. 4, 361–376.
H. Lemke, "Eigensohaften einiger Storstellenkomplexe von Zink in Silizium", Phys. Stat. Sal. (A) 72, 1982, p. 177–187.
J.A. Burton, "Impurity Centers in Ge and Si", Physica XX, 1954, p. 845–854.
B.J. Baliga, "Modern Power Devices", 1987, p. 79–129.

* cited by examiner

Primary Examiner—Howard Weiss
(74) Attorney, Agent, or Firm—Kenyon & Kenyon

(57) ABSTRACT

A silicon-based semiconductor component includes a high-efficiency barrier junction termination. In the semiconductor component, a silicon semiconductor region takes on the depletion region of an active area of the semiconductor component. The junction termination for the active area is formed with silicon with a doping that is opposite to that of the semiconductor region, and the junction termination surrounds the active area on or in a surface of the semiconductor region. The junction termination is doped with a dopant that has a low impurity energy level of at least 0.1 eV in silicon. Preferably Be, Zn, Ni, Co, Mg, Sn or In are used as acceptors and S, Se or Ti are provided as donors.

36 Claims, 8 Drawing Sheets

SILICON-BASED SEMICONDUCTOR COMPONENT WITH HIGH-EFFICIENCY BARRIER JUNCTION TERMINATION

FIELD OF THE INVENTION

The present invention is directed to a semiconductor component, particularly to a semiconductor component with a high-efficiency barrier junction termination.

BACKGROUND INFORMATION

In general, a semiconductor component contains at least one active semiconductor area and a semiconductor region acting as either an n or p type drift region. Such a semiconductor component also includes two electrodes for applying an operating voltage to the drift region, as well as usually other semiconductor regions for forming component-specific semiconductor structures. In an on state of the component, the drift region carries the electric current of the charge carriers between the two electrodes. In the off state of the component, however, the drift region takes on a depletion region of a p-n junction formed with the drift region or of a metal-semiconductor barrier contact (Schottky contact) which is formed as a result of the operating voltages applied that are relatively high compared to those in the on state. The depletion region is often also called the space charge region or barrier layer. Distinction is made between unipolar and bipolar semiconductor areas. In unipolar active semiconductor areas, only one kind of charge carriers (electrons or holes) determines the operation, while in bipolar active semiconductor areas, both charge carrier types, electrons and holes, contribute to the operation.

In the off state, relatively strong electric fields are created on the surface of the component. Therefore it is important to ensure the stable transition of these electric surface fields into the medium surrounding the component with a maximum field intensity that is clearly below the average field intensity of the surrounding medium. The surrounding medium can be dielectric insulating and/or passivating layers, or a surrounding gas, usually air. The problem of excessively high field intensities on the surface of a component appears especially in the case of high off-state voltages, which occur in power electronics applications in which small dimensions with high field line curvatures or high doping of the semiconductor regions is present. To reduce the field intensity on the surface of the component, a device known as a junction termination is used. The junction termination is produced on the component surface and surrounding the active semiconductor area. In addition to electrically shielding the active semiconductor area outward, the junction termination also reduces the field line curvatures around the active semiconductor area in order to diminish excessively intense fields in the area close to the surface within the semiconductor component.

Different embodiments of junction terminations for p-n junctions of silicon-based power electronics semiconductor components are described in "Modern Power Devices" by B. J. Baliga, 1987, John Wiley & Sons (USA), pp. 79–129. Such p-n junctions are usually produced by diffusion of a dopant into the surface of a silicon layer acting as a drift region, with the diffused region being of the opposite conduction type compared to the silicon layer. Due to field line curvature, an extra-high intensity field is produced at the edge of the diffused region compared to the planar p-n junction, depending on the depth of this region.

In a first known embodiment, floating field rings can be provided as junction terminations, which are also produced through diffusion around the diffused region of the p-n junction of the silicon layer. These field rings are of the same conduction type as the diffused layer of the p-n junction and are insulated from the diffused region and from one another by the silicon layer doped for the opposite conduction type. One or more field rings can be provided. A second method for obtaining a junction termination consists of removing material, and thus charges, from around the edge of the p-n junction by mechanical abrasion or etching ("beveled-edge termination" or "etch contour termination"). Mesa structures are obtained as junction terminations.

A third known junction termination for a p-n junction is a device called a field plate, which is produced by applying an oxide layer to the edge area around the p-n junction and a metallic layer on the oxide layer. A field is applied to the metallic layer to change the surface potential at the edge of the p-n junction. Thus, the depletion region of the p-n junction and, therefore, the field as well can be expanded. The field plate can also be formed using an electrode layer that overlaps the oxide layer in the edge area of the p-n junction, which is provided for the p-n junction for the application of an operating voltage. A junction termination can also be formed by combining field plates and field rings ("Modern Power Devices," p. 119).

In a fourth known embodiment of a junction termination, ion implantation is used to introduce opposite charges in a controlled manner in the surface of the silicon layer provided as a drift region. Such a junction termination is called a "junction termination extension". The implanted region is of the same conduction type as the diffused semiconductor region of the p-n junction, and, thus, it not only is doped with the opposite charge compared to the drift region, but it also has a lower doping amount than the diffused region. In this fourth embodiment, in addition to a region diffused into the drift region, the p-n junction can also be formed using a silicon layer arranged on the surface of the drift region with opposite doping in relation to the drift region. Ion implantation into the junction termination then takes place at the edge of the two silicon layers forming the p-n junction. The p-n junction is virtually extended by this "junction termination extension," the electric field is broadened, and the field curvature is reduced. The breakdown strength of the component is therefore increased.

Another junction termination comparable with the junction termination extension is described in Swiss Patent No. A-659,542 and referred to there as a barrier layer extension area. This junction termination is provided for a p-n junction as a bipolar active semiconductor area of a semiconductor component and can be produced by ion implantation or epitaxial growth. The lateral dimension ($W_{JER}$) of the barrier layer extension area is set greater than approximately one-half of the depletion width ($W_{id}$) of the low-dope side of the p-n junction. For lateral dimensions of more than one-half of the depletion width ($W_{id}$), no further improvement is obtained in this prior art junction termination.

In "Modern Power Devices," p. 128, the "junction termination extension" is proposed for bipolar transistors (BJT), field-effect transistors (MOSFETs), and thyristors (silicon-controlled rectifiers or SCRs). Due to the additional parasitic diode created with this junction termination, however, bipolar leak currents are generated in the off state of the component and high stored charges during the operation of the component, which can result in serious problems, especially in the case of a unipolar silicon MOSFET. These leak currents and stored charges increase considerably if the junction termination is enlarged, since the charge carrier injection of the parasitic diode increases with the surface area of the junction termination.

SUMMARY OF THE INVENTION

An object of the present invention is to provide a silicon-based semiconductor component with a junction termination that does not considerably increase the stored charge in the on state of the component.

This object is achieved in accordance with a semiconductor component comprising at least one semiconductor region made of silicon of a first conduction type which acquires a depletion region in the active area of the component when an off-state voltage is applied to the active area. A junction termination for the active area is formed by silicon of the opposite conduction type compared to the semiconductor region taking on a depletion region. The junction termination is arranged around the active area in or on the surface of this semiconductor region. A doping agent (dopant) having a low impurity energy level of at least 0.1 eV (100 meV) is provided for this junction termination. For a junction termination with p-type conduction, the dopant is an acceptor and its energy level is an acceptor level, given with reference to the valence band of the silicon crystal. For a junction termination with n-type conduction, the dopant is a donor, and its energy level is a donor level, given with reference to the conduction band of the silicon crystal.

The operation of the semiconductor component of the present invention is based on the fact that the dopant atoms (impurity atoms, atomic lattice defects) in the junction termination are virtually non-ionized at relatively low on-state voltages, which typically is up to a maximum of 5 volts in the on state of the semiconductor component, within the temperature range allowed for silicon. This is due to the low energy levels of the dopant atoms. On the other hand, the dopant atoms are at least mostly ionized at the high off-state voltages of typically 100 volts to 5000 volts in the off state of the semiconductor component. In the on state of the semiconductor component, the voltage drop across the active area remains below that of the parasitic p-n diode formed with the junction termination and the semiconductor area with opposite doping, and the junction termination emits basically no charge carrier. Thus, virtually no additional stored charges are produced by the junction termination. This is a considerable advantage in comparison with the prior art silicon junction terminations doped with dopants having relatively flat energy levels such as boron (B), with an acceptor level of 0.045 eV, phosphorus (P), with a donor level of 0.045 eV, or arsenic (As), with a donor level of 0.054 eV. In contrast, considerably higher electric fields are applied to the junction termination in the off state of the semiconductor element due to the relatively high off-state voltages. The deep-lying impurities in the silicon of the junction termination are at least mostly ionized by these electric fields and produce a stable space charge according to their spatial distribution. This space charge also electrically shields the active area of the semiconductor component against external fields and charges.

Other acceptors for the junction termination include beryllium (Be), with an acceptor level of 0.17 eV, zinc (Zn), with an acceptor level of 0.26 eV, nickel (Ni), with an acceptor level of 0.23 eV, cobalt (Co), with an acceptor level of 0.35 eV, magnesium (Mg), with an acceptor level of 0.17 eV, tin (Sn), with an acceptor level of 0.27 eV, and/or indium (In), with an acceptor level of 0.16 eV. Sulfur (S), with a donor level of 0.26 eV, selenium (Se), with a donor level of 0.25 eV, and/or titanium (Ti), with a donor level of 0.21 eV are preferably used as donors.

The junction termination can be configured in the form of a field ring structure.

In a further embodiment of the present semiconductor component, the silicon semiconductor region is expanded, preferably in at least one lateral direction, to take on the depletion region of the active area, for example, as a silicon epitaxial layer, and the vertical dimension of the depletion region depends on the off-state voltage applied to the active area. At least one lateral dimension of the junction termination is now greater than the maximum vertical dimension of the depletion region (maximum depletion region depth). A lateral direction is defined as a direction that is basically parallel to a surface of the silicon semiconductor area, and a vertical direction is defined as a direction basically perpendicular to the surface of the semiconductor area. Therefore, a relatively large-surface p-n junction is built into the semiconductor component between the junction termination and the semiconductor region. The electric field is widened and, similar to the active area of the semiconductor component, almost fully shielded against external charges and fields in the area of the drift region surface due to the removal of the charge carriers from the space charge zone of this built-in p-n junction. An avalanche breakdown takes place far from the surface of the semiconductor region, at a certain depth. Because the junction termination has a greater lateral dimension than the maximum vertical dimension of the depletion region, the breakdown voltage of the semiconductor component is considerably less sensitive to doping or to charge carrier concentration fluctuations in the junction termination. In this embodiment, the junction termination is preferably directly adjacent to the active area.

The depletion region of the p-n junction is formed by the junction termination and the semiconductor region. This depletion region, and thus, the widening of the electric field on the surface of the semiconductor region, can be further adjusted by setting the lateral dimension or the vertical dimension or the doping profile of the junction termination. Such an adjustment further increases the breakdown strength and the adjustment tolerance of the semiconductor component.

The lateral dimension of the junction termination is preferably set to be greater than the maximum vertical dimension of the space charge zone of the semiconductor area by a factor of three.

In a further embodiment, the junction termination includes at least two semiconductor areas of different dopings. In this embodiment, smoother widening of the electric field can be achieved. The semiconductor component is especially robust with regard to manufacturing tolerances with such a multistage-doped junction termination. The at least two semiconductor areas can be arranged vertically on top of one another or laterally next to one another.

In another embodiment, an electric contact provided for the active area of the semiconductor component can also at least partially overlap the junction termination. Thus, the junction termination can be set to a pre-defined potential. The junction termination can be grown epitaxially on the surface of the semiconductor area provided as a drift region or produced by diffusion or ion implantation into the semiconductor area.

The semiconductor component preferably has at least one unipolar active area, for example, a MISFET structure or a Schottky diode structure, but can also be provided with at least one bipolar active area such as, for example, a p-n diode, an IGBT, GTO or thyristor structure.

DETAILED DESCRIPTION OF THE INVENTION

Figure 1:
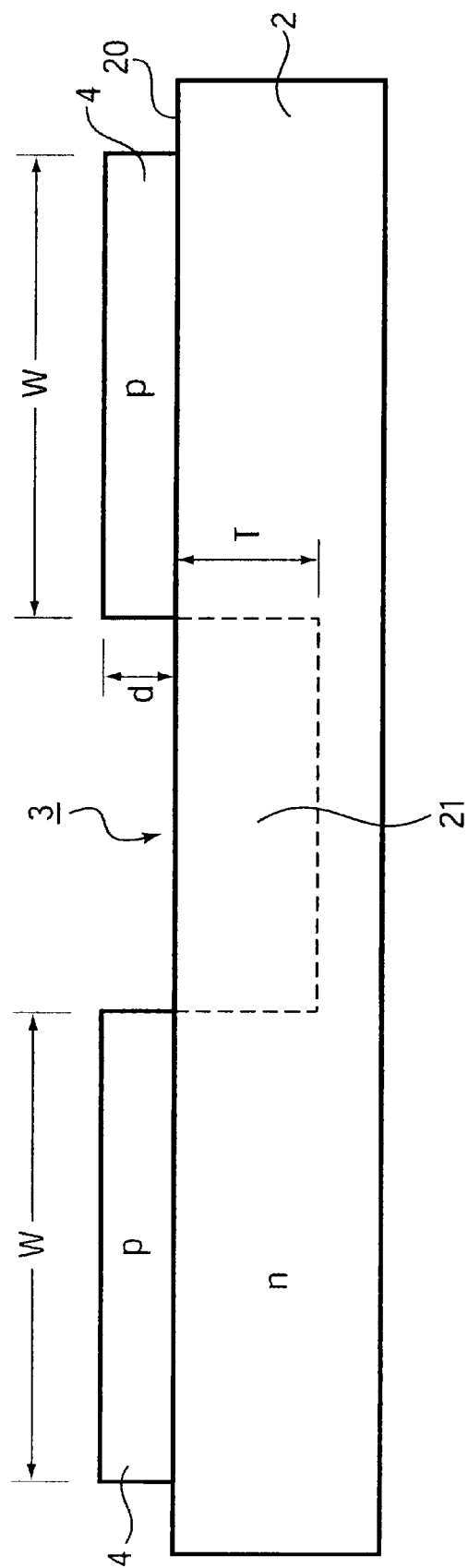
FIG. 1 shows a schematic diagram of a semiconductor component with a junction termination.

FIG. 1 shows a semiconductor region 2, an electronically active area 3, and a junction termination 4 for the electronically active area 3. A surface 20 of semiconductor region 2 and a depletion zone 21 of the active area 3 are formed in semiconductor region 2. Semiconductor region 2 forms the drift region of the semiconductor component and takes on depletion region 21 of active area 3 in the off state of the semiconductor component. This depletion region 21 can be the space charge region of a p-n junction between two semiconductors of opposite type conductions formed in the active area 3 with semiconductor region 2, or the barrier layer of a Schottky contact between a metal and a semiconductor. The semiconductor component shown is of the vertical type, in which the current flows basically in the vertical direction, i.e., substantially perpendicular to surface 20 in the on state of the semiconductor component. In power electronics, such vertical semiconductor components are mainly used. In principle, the junction termination 4 of the invention is also possible for lateral semiconductor components, i.e., with lateral current flow (i.e., basically parallel to surface 20, i.e., planar technology).

The vertical dimension of depletion region 21 depends on the off-state voltage applied across one of the electrodes (not illustrated) in the active area 3. The maximum vertical dimension of depletion region 21, corresponding to a predefined off-state voltage, is designated by the letter T. At least one lateral dimension and preferably all lateral dimensions of semiconductor region 2 is greater than its vertical dimension. Semiconductor region 2 is preferably a silicon layer applied to a substrate (not illustrated), for example, grown epitaxially, which in general has a lower doping than the substrate.

Junction termination 4 for the active area of the semiconductor component is arranged on or in surface 20 of semiconductor region 2. Junction termination 4 laterally surrounds the entire active area. Furthermore, junction termination 4 is made of silicon of the opposite conduction type compared to semiconductor region 2. In the example illustrated, semiconductor region 2 has n-type conduction and the junction termination 4 has p-type conduction. On the other hand, for a semiconductor region 2 with p-type conduction, a junction termination 4 with n-type conduction is provided. Junction termination 4 is preferably produced by diffusion or ion implantation of dopant particles into surface 20 of the silicon semiconductor region 2, or by growing an appropriately doped epitaxial silicon layer on surface 20 of the semiconductor region 2.

In the embodiment illustrated in FIG. 1, junction termination 4 is preferably in contact with active area 3. In an embodiment illustrated as an example in FIG. 5, with at least one field ring as a junction termination, the junction termination is insulated from active area 3 by semiconductor region 2.

The lateral dimension W of junction termination 4 is preferably greater than the maximum vertical dimension T of depletion region 21 in semiconductor region 2. The lateral dimension W of junction termination 4 is preferably at least three times the maximum vertical dimension T of depletion region 21. For a depletion zone dimension T of 10 μm, for example, the lateral dimension W of junction termination 4 is preferably set between 50 μm and 150 μm. The vertical dimension d of junction termination 4 is preferably basically constant. In particular, by setting the vertical dimension d of junction termination 4 to an experimentally determinable value, the semiconductor component can be made more robust with regard to manufacturing tolerances in doping junction termination 4. The vertical dimension d of junction termination 4 is typically between 0.1 μm and 5 μm.

With such a junction termination 4, a relatively large-surface p-n junction is built into the semiconductor component in the area of surface 20 of the semiconductor region 2. The space charge region of this p-n junction formed in the off state of the semiconductor component shields, on the one hand, against electric fields and charges external to the component and, on the other hand, causes the electric field to widen in the area of surface 20. Thus, the breakdown strength of the component is increased, and higher off-state voltages can be applied to the active area 3.

For junction termination 4, only one dopant is provided, which has at least one low impurity energy level of approximately 0.1 eV (100 meV). The dopant atoms built into the silicon crystal lattice in junction termination 4 are virtually not ionized at the relatively low on-state voltages. Typically, due to the low energy levels of the dopant atoms, the maximum on state voltage for the silicon component is 5 volts at the operating temperature for silicon. In the on state of the semiconductor component, the voltage drop across active area 3 is therefore lower than that of the parasitic p-n diode formed with junction termination 4 and the semiconductor region 2. In this situation, junction termination 4 emits basically no charge carriers. Thus, especially in the case of a unipolar semiconductor component, virtually no additional stored charges are produced by junction termination 4.

On the other hand, at high off-state voltages, such as 100 V to 5000 V in the off state of the semiconductor component, high electric fields are applied to junction termination 4. In the off state of the semiconductor component, the dopant atoms in junction termination 4 are at least highly ionized by these electric fields despite their low impurity level, and they produce a stable space charge according to their spatial distribution. This space charge causes junction termination 4 to electrically shield the active area 3 of the semiconductor component.

For a junction termination 4 with p-type conduction, dopants that are acceptors in silicon are chosen. Preferred acceptors for junction termination 4 are beryllium (Be), with an acceptor level of 0.17 eV, zinc (Zn), with an acceptor level of 0.26 eV, nickel (Ni), with an acceptor level of 0.23 eV, cobalt (Co), with an acceptor level of 0.35 eV, magnesium (Mg), with an acceptor level of 0.17 eV, tin (Sn), with an acceptor level of 0.27 eV, and/or indium (In), with an acceptor level of 0.16 eV.

For a junction termination 4 with n-type conduction, silicon dopants acting as donors are used for junction termination 4. Sulfur (S), with a donor level of 0.26 eV, selenium (Se), with a donor level of 0.25 eV, and/or titanium (Ti), with a donor level of 0.21 eV are preferably used as donors. All the above-named dopants can be introduced in silicon either by an epitaxial process, a diffusion process, or an ion implantation process. The silicon of junction termination 4 can be doped with one or more dopants. Dopant concentrations are selected as a function of the vertical dimension of junction termination 4, and they usually vary between $10^{13}$ cm$_{-3}$ and $10^{16}$ cm$^{-3}$, and preferably between $1 \times 10^{15}$ cm$^{-3}$ and $5 \times 10^{15}$ cm$^{-3}$.

Figure 2:
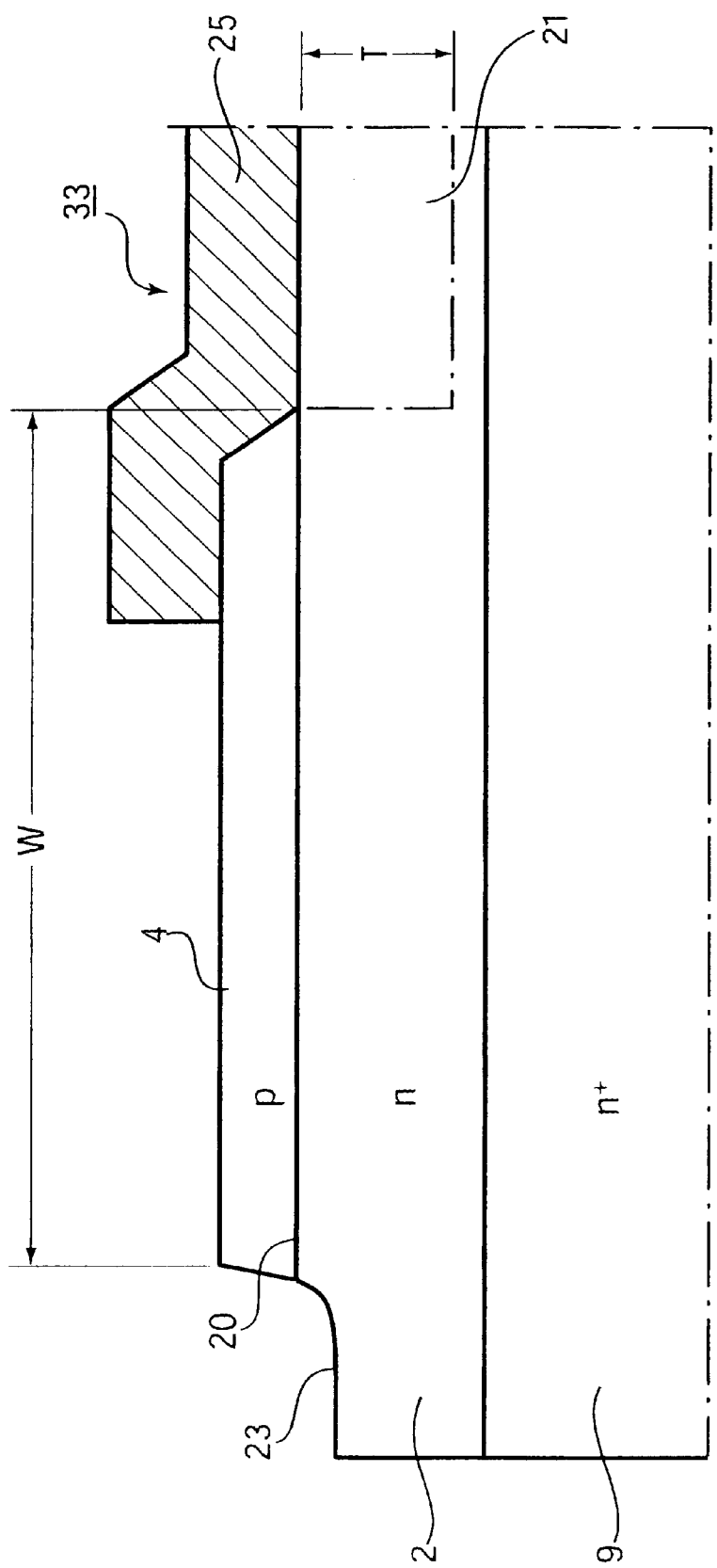
FIG. 2 shows a section of a semiconductor component with a junction termination for a Schottky diode structure in cross section.

FIG. 2 shows a cross section portion of an embodiment of a semiconductor component, in which at least one Schottky diode structure 33 serves as a unipolar active area. An epitaxially grown silicon layer, doped for n-type conduction, is arranged as semiconductor region 2 on a substrate 9 also doped for n-type conduction. Schottky diode structure 33 contains a generally metallic contact 25 as a Schottky contact arranged on surface 20 of semiconductor region 2. The barrier layer of the Schottky diode structure 33 formed under contact 25 in semiconductor region 2 when an off-state voltage is applied, forms depletion region 21 in the active area of the semiconductor component. Directly adjacent to contact 25 is a semiconductor layer doped for p-type conduction, grown epitaxially on semiconductor region 2, as junction termination 4. The junction termination 4 has a considerably greater dimension in its layer plane (lateral dimension W) than the layer thickness of the semiconductor region 2, and thus, also greater than the maximum vertical dimension T of depletion region 21. Junction termination 4 can extend up to the edge of semiconductor region 2. Contact 25 is preferably arranged on a portion of junction termination 4 (overlapping contact). Furthermore, semiconductor region 2 and junction termination 4 can be provided with a groove 23 on their outer edges facing away from the active area, for example, with a beveled etched edge. In the on state of the semiconductor component, the voltage drop between contact 25 and another electrode (not illustrated) in Schottky diode structure 33 remains below the voltage drop of a parasitic p-n diode between junction termination 4 and semiconductor region 2. This ensures basically stored charge-free operation of the unipolar component.

Figure 3:
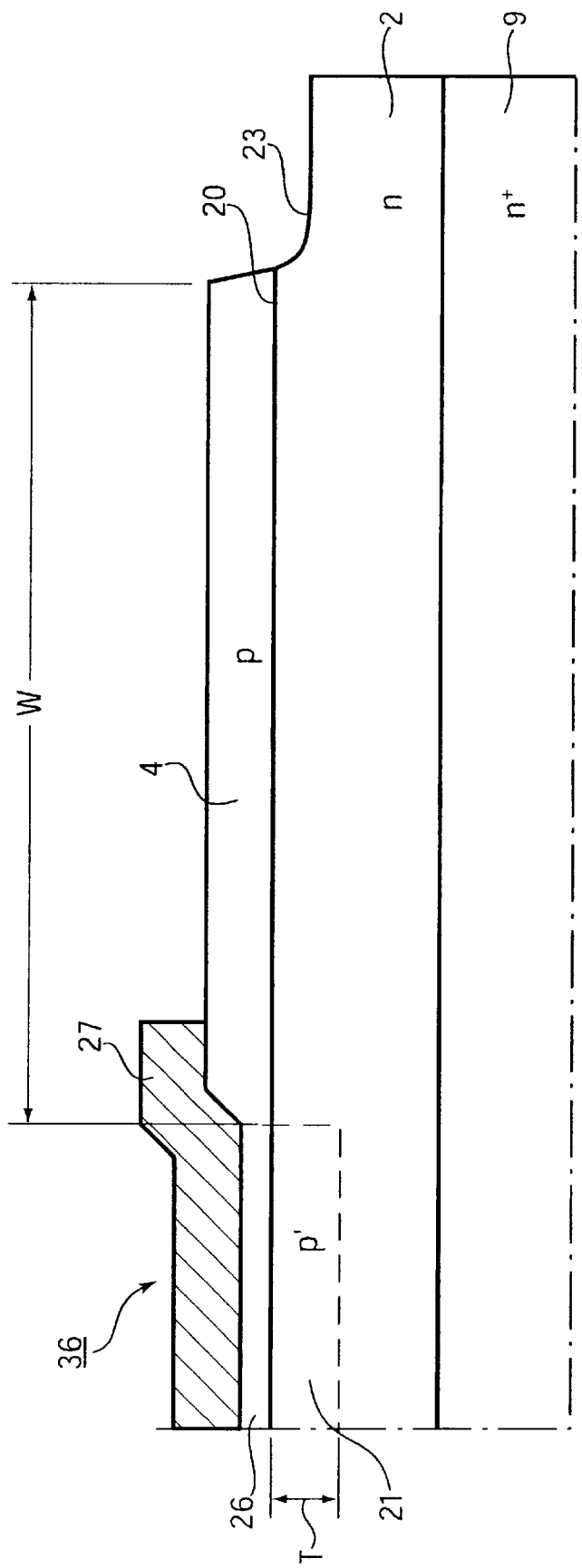
FIG. 3 shows a section of a semiconductor component with a junction termination for a p-n diode structure in cross section.

FIG. 3 shows a cross-section of part of a semiconductor component with at least one p-n diode structure 36 as a bipolar active area. Semiconductor region 2 is grown epitaxially on a semiconductor substrate 9 and is of the same conduction type as substrate 9 (n-type). The p-n junction of the p-n diode structure 36 is formed by semiconductor region 2 with n-type conduction and a semiconductor region 26, preferably grown epitaxially on surface 20 of semiconductor region 2, with p-type conduction. An ohmic contact 27 is arranged on the semiconductor region 26 with p-type conduction. The space charge region of the p-n junction of p-n diode structure 36 forms depletion region 21 of the active area. A silicon layer with p-type conduction, preferably grown epitaxially on surface 20 of semiconductor region 2, is provided as a junction termination 4 for the p-n diode structure 36. This silicon layer of junction termination 4 is directly adjacent to semiconductor region 26 with p-type conduction of p-n diode structure 36. Ohmic contact 27 can again partially overlap junction termination 4. In addition, a groove 23 may be provided again at the edge of semiconductor region 2. Instead of epitaxially grown semiconductor regions, ion-implanted semiconductor regions can, of course, also be provided. All semiconductor regions are preferably formed with silicon.

Figure 4A:
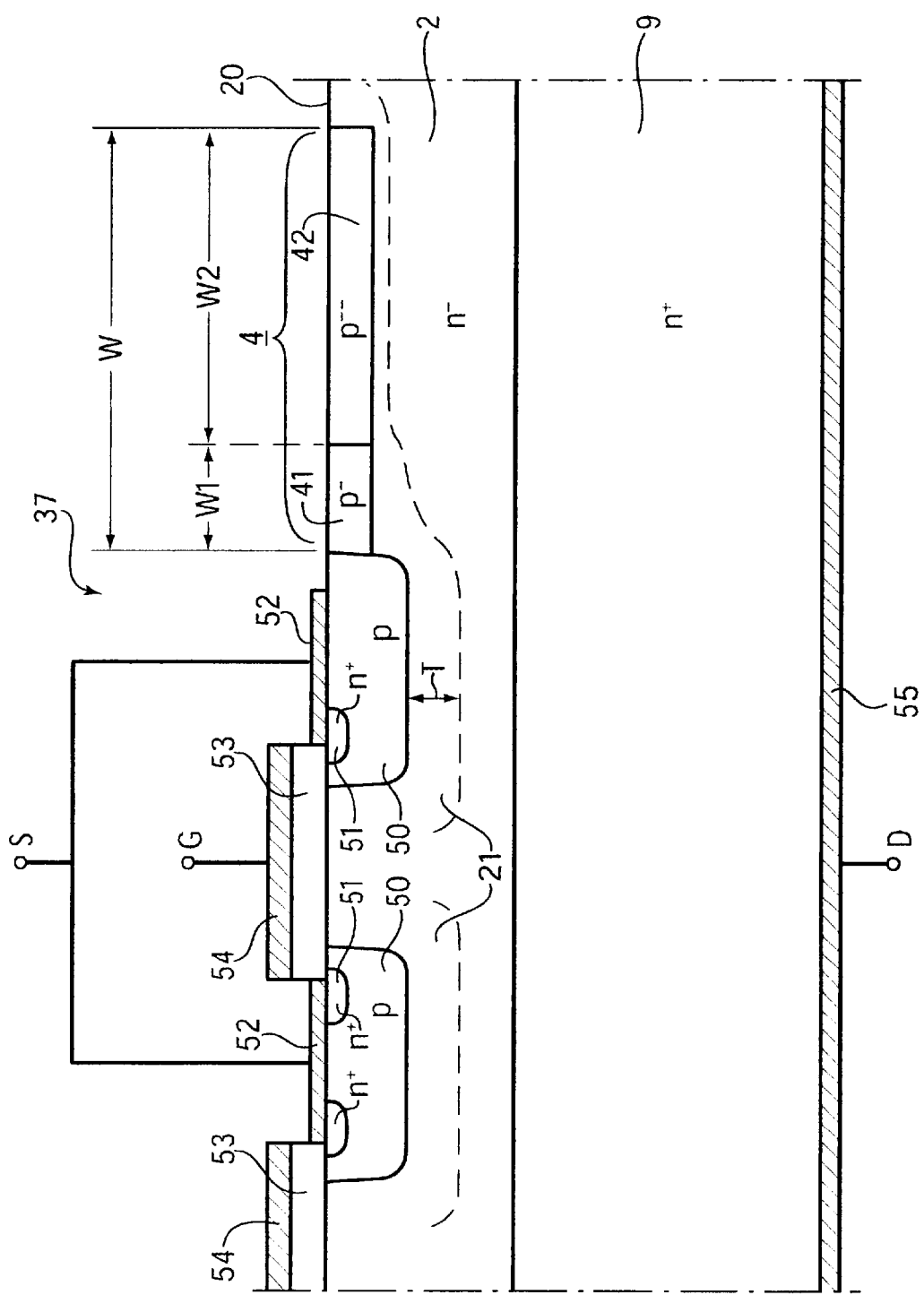
FIG. 4A shows a cross-sectional view of a section of a first embodiment of a semiconductor component with a junction termination with two semiconductor areas of opposite dopings for a MISFET structure.

FIG. 4A illustrates a semiconductor component with at least one MISFET structure 37 as another embodiment of a semiconductor component with a unipolar active area. Semiconductor region 2 with n-type doping, arranged on substrate 9 with n$^+$-type doping, represents the drift region of MISFET structure 37. MISFET structure 37 includes at least one base region 50 with p-type doping, produced in surface 20 of semiconductor region 2 by ion implantation or diffusion, at least one source region 51, also produced within base region 50 by ion implantation or diffusion, at least one source electrode 52 of source S, through which source region 51 and base region 50 are electrically short-circuited, a gate electrode 54 of gate G (insulated gate) arranged over an electrically insulated insulation layer 53, connecting source region 51 to semiconductor region 2 through a channel region of base region 50, and a drain electrode 55 of drain D, arranged on the side facing away from semiconductor region 2 of substrate 9. Depletion region 21 of the p-n junction formed between base region 50 and semiconductor region 2 on semiconductor region 2 is shown schematically. MISFET structure 37 can be formed by individual cells, as shown in FIG. 4A, with one base region 50 each, and at least one source region 51 with the respective source electrode 52 and the insulated gate electrode 54 overbridging the individual cells. Such cell designs are known in a multiplicity of versions. Junction termination 4 for MISFET structure 37 is directly adjacent to base region 50 on the outer edge of MISFET structure 37 and is doped for conduction of the opposite type compared to semiconductor region 2, like base region 50. Junction termination 4 is preferably produced through ion implantation of dopant particles in surface 20 of the semiconductor region. Junction termination 4 and/or base region 50 of MISFET structure 37 can, however, also be epitaxial layers.

In the advantageous embodiment represented in FIG. 4A, junction termination 4 is formed by at least two semiconductor regions 41 and 42 with opposite doping. The semiconductor regions 41 and 42 are arranged laterally next to one another on surface 20 of semiconductor region 2 and are preferably both implanted or diffused or both grown epitaxially. Preferably, both semiconductor regions 41 and 42 have approximately the same vertical dimension.

Semiconductor region 41, directly adjacent to MISFET structure 37 has a lower doping level (p$^-$) than the adjacent base region of MISFET structure 37 and a higher doping level than semiconductor region 42 with p$^{--}$ doping, laterally adjacent on the side facing away from this base region 50. Thus, a junction termination 4 with stepped doping is obtained. In an advantageous embodiment, the lateral dimension W1 of the first semiconductor region 41 is set smaller than the lateral dimension W2 of the second semiconductor region 42. The total lateral dimension W of junction termination 4 is obtained as the sum of the individual dimensions W1 and W2 of the two semiconductor regions 41 and 42. This total lateral dimension W of junction termination 4 is greater than the maximum vertical dimension T of depletion region 21 of MISFET structure 37.

Figure 4B:
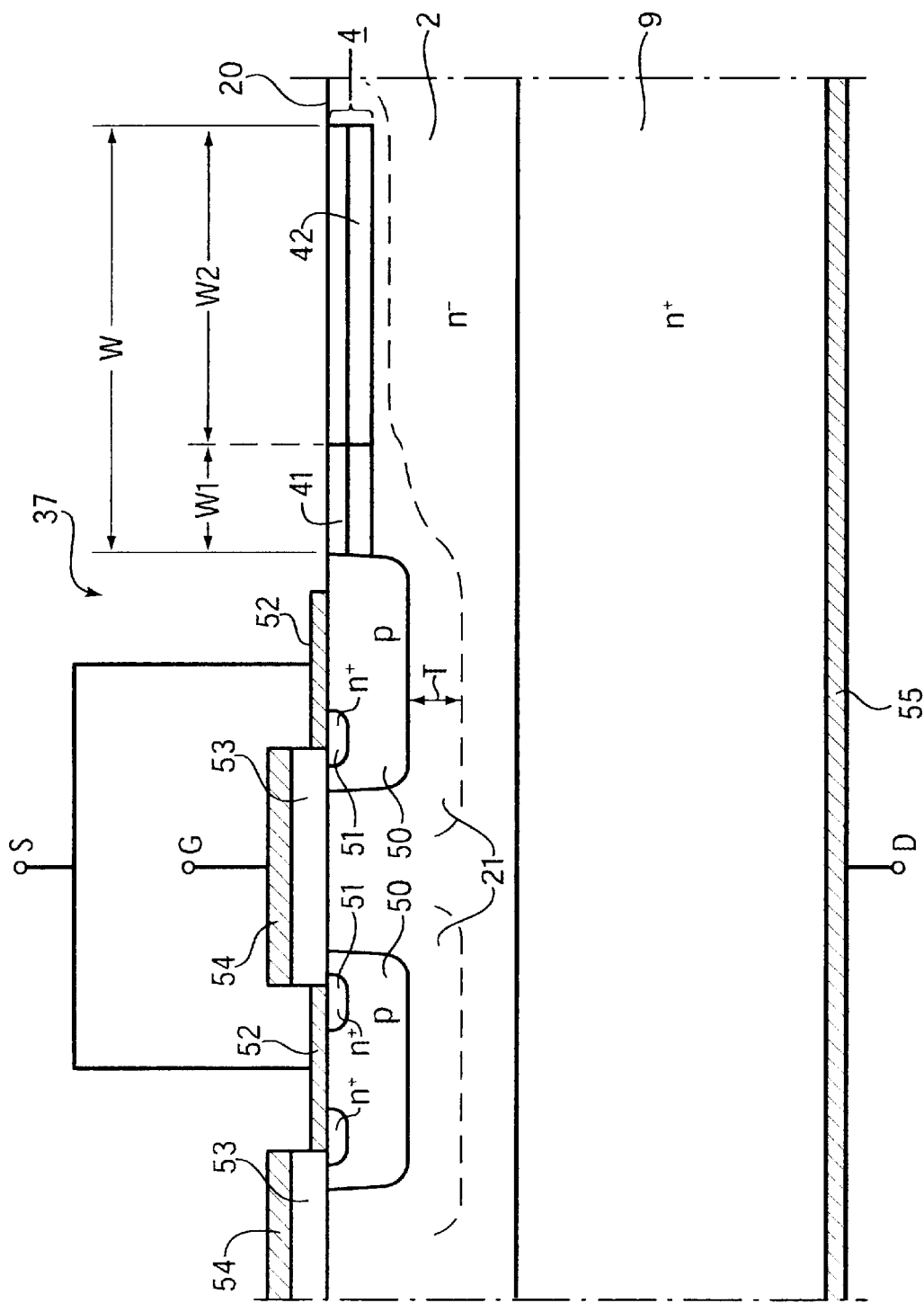
FIG. 4B shows a cross-sectional view of a section of a second embodiment of a semiconductor component with a junction termination with two semiconductor areas of opposite dopings for a MISFET structure.

The two semiconductor regions 41 and 42 can also be arranged vertically on top of one another in an embodiment such as that shown in FIG. 4B. Such a vertical design can be produced, for example, by ion implantation or diffusion with different penetration depths or by growing the semiconductor regions epitaxially successively on top of one another. The lower semiconductor region has then preferably a lower doping level than the upper semiconductor region. The lateral dimension W of the junction termination is then basically determined by the greatest lateral dimension of the individual semiconductor regions arranged on top of one another. The lateral dimensions of all semiconductor regions are preferably at least approximately the same.

Furthermore, the junction termination can also consist of a lateral or a vertical arrangement of more than two differently doped semiconductor regions, with the doping preferably decreasing laterally outward or vertically downward.

Such multistage junction terminations are not limited to semiconductor components with MISFET structures, but can also be provided for any other semiconductor component. These junction terminations with multistage dopings have the advantage that the electric field is weaker from the active area outward in the area of surface 20 of semiconductor region 2.

Furthermore, in all of the above-described embodiments of the present invention, the conduction types of all semiconductor regions can be reversed.

Figure 5:
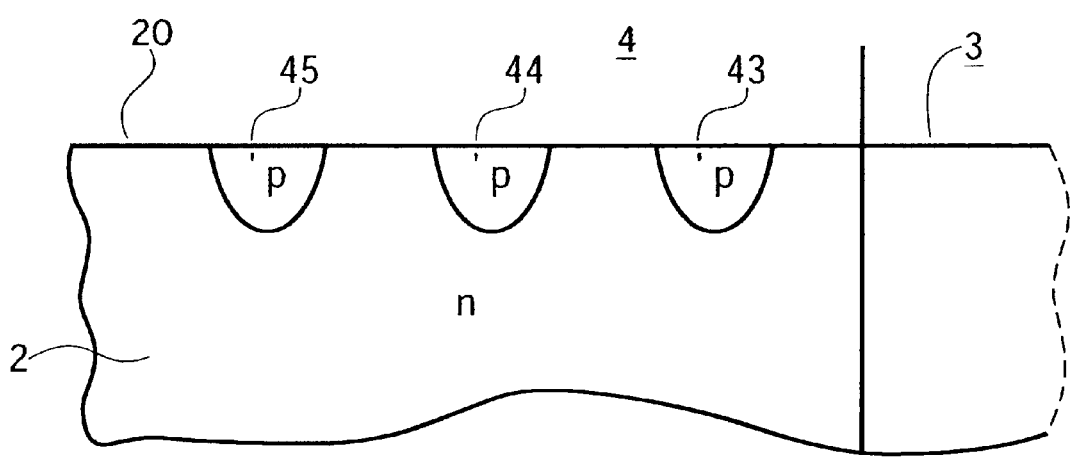
FIG. 5 shows a section of a semiconductor component with a field ring structure junction termination in cross section.
Figure 6:
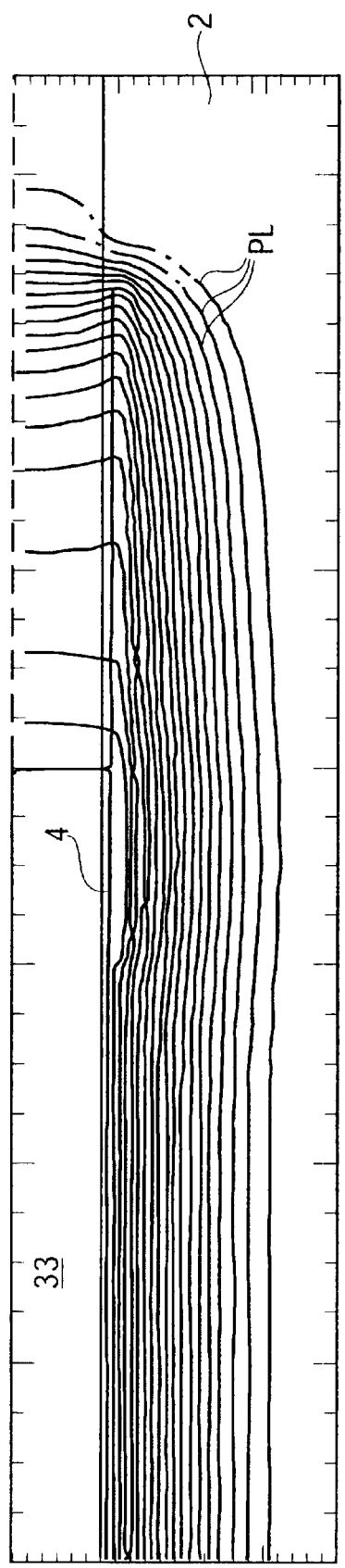
FIG. 6 shows a section of a field distribution for a semiconductor component with a Schottky diode structure in cross section.
Figure 7:
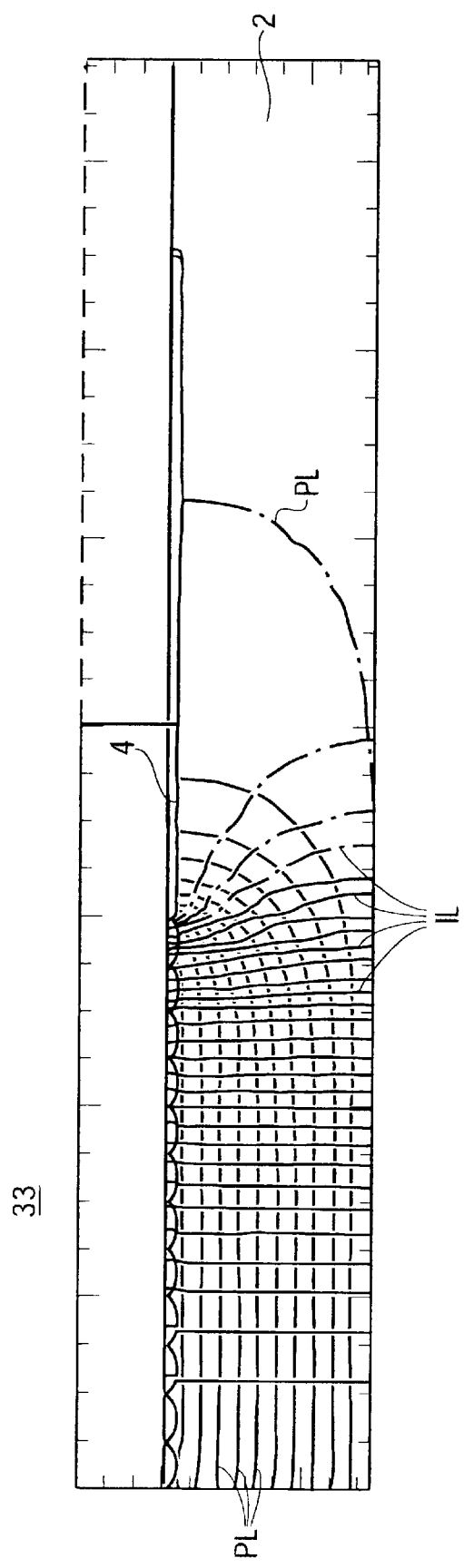
FIG. 7 shows the current flow in a semiconductor component with a Schottky diode structure in cross section.

FIG. 5 shows an embodiment of a semiconductor component with a field ring structure as junction termination 4. Three field rings 43, 44, and 45 are shown, spaced from one another, around active area 3 of the semiconductor component. The innermost field ring 43 is insulated from active area 3 by semiconductor region 2. Individual field rings 43, 44, and 45 are insulated from one another by semiconductor region 2 and preferably diffused into surface 20 of silicon semiconductor region 2. The shape of the field lines in the area of surface 20 of semiconductor region 2 can be adjusted through the number of field rings of the field ring structure and the spacing of the field rings. FIGS. 6 and 7 show the results of numerical computer-aided simulations of semiconductor components with junction terminations according to the present invention. The computations are based on silicon as the semiconductor material for the semiconductor component. Nickel (Ni) was chosen as the dopant for junction termination 4 in a dopant concentration of $5 \times 10^{15}$ cm$^{-3}$. The depth of junction termination 4 is 1 $\mu$m and the lateral dimension is five times the vertical dimension of semiconductor region 2.

FIG. 6 shows a potential distribution that is possible according to the invention, using the example of a semiconductor component with a Schottky diode structure 33. The electric equipotential lines are denoted by the letters PL.

FIG. 7 shows the current flow in a semiconductor component with a Schottky diode structure 33 and a junction termination 4 according to the invention at an operating temperature of 80° C. The current flow lines are denoted by the letters IL.

In all embodiments of the present invention, additional passivation layers made of dielectric or semi-insulating materials can be provided in addition to junction termination 4. The passivation layers can consist, in particular, of amorphous SiC, amorphous silicon (Si) or amorphous carbon (C).

What is claimed is:

1. A semiconductor component comprising:
    at least one silicon semiconductor region with n-type conduction, the semiconductor region forming a depletion region in an active area of the semiconductor region when an off-state voltage is applied to the active area; and
    a junction termination for the active area, the junction termination being disposed around the active area at or in a surface of the semiconductor region, the junction termination comprising silicon with p-type conduction, the silicon with p-type conduction of the junction termination being doped with at least one dopant having an acceptor level of at least approximately 0.1 eV in silicon.

2. The semiconductor component according to claim 1, wherein beryllium is provided as the dopant for the junction termination.

3. The semiconductor component according to claim 1, wherein zinc is provided as the dopant for the junction termination.

4. The semiconductor component according to claim 1, wherein nickel is provided as the dopant for the junction termination.

5. The semiconductor component according to claim 1, wherein cobalt is provided as the dopant for the junction termination.

6. The semiconductor component according to claim 1, wherein magnesium is provided as the dopant for the junction termination.

7. The semiconductor component according to claim 1, wherein tin is provided as the dopant for the junction termination.

8. The semiconductor component according to claim 1, wherein indium is provided as the dopant for the junction termination.

9. The semiconductor component according to claim 1, wherein:
    a lateral dimension of the semiconductor region is greater in at least one lateral direction that is approximately parallel to the surface of the semiconductor region than a vertical dimension of the semiconductor region that is approximately perpendicular to the surface of the semiconductor region,
    a vertical dimension of the depletion region is a function of the off-state voltage applied to the active area, and
    a lateral dimension of the junction termination is greater than a maximum vertical dimension of the depletion region.

10. The semiconductor component according to claim 9, wherein the lateral dimension of the junction termination is at least three times the maximum vertical dimension of the depletion region.

11. The semiconductor component according to claim 9, wherein the junction termination includes at least two semiconductor regions with different dopant concentrations.

12. The semiconductor component according to claim 11, wherein the at least two semiconductor regions are arranged laterally next to one another.

13. The semiconductor component according to claim 11, wherein the at least two semiconductor regions are arranged vertically on top of one another.

14. The semiconductor component according to claim 9, wherein an electric contact provided for the active area at least partially overlaps the junction termination.

15. The semiconductor component according to claim 1, wherein the junction termination is configured as a field ring structure.

16. The semiconductor component according to claim 1, wherein the junction termination is grown epitaxially onto the surface of the semiconductor region.

17. The semiconductor component according to claim 1, wherein the junction termination is produced by ion implantation.

18. The semiconductor component according to claim 1, wherein the junction termination is produced by diffusion.

19. The semiconductor component according to claim 1, further comprising a unipolar active area.

20. The semiconductor component according to claim 1, further comprising a bipolar active area.

21. A semiconductor component comprising:

at least one silicon semiconductor region with p-type conduction, the semiconductor region forming a depletion region in an active area of the semiconductor region when an off-state voltage is applied to the active area; and a junction termination for the active area, the junction termination being disposed around the active area at or in a surface of the semiconductor region, the junction termination comprising silicon with n-type conduction, the silicon with n-type conduction of the junction termination being doped with at least one dopant having a donor level of at least approximately 0.1 eV in silicon.

22. The semiconductor component according to claim 21, wherein sulfur is provided as the dopant for the junction termination.

23. The semiconductor component according to claim 21, wherein selenium is provided as the dopant for the junction termination.

24. The semiconductor component according to claim 21, wherein titanium is provided as the dopant for the junction termination.

25. The semiconductor component according to claim 21, wherein:

a lateral dimension of the semiconductor region is greater in at least one lateral direction that is approximately parallel to the surface of the semiconductor region than a vertical dimension of the semiconductor region that is approximately perpendicular to the surface of the semiconductor region, a vertical dimension of the depletion region is a function of the off-state voltage applied to the active area, and a lateral dimension of the junction termination is greater than a maximum vertical dimension of the depletion region.

26. The semiconductor component according to claim 25, wherein the lateral dimension of the junction termination is at least three times the maximum vertical dimension of the depletion region.

27. The semiconductor component according to claim 25, wherein the junction termination includes at least two semiconductor regions with different dopant concentrations.

28. The semiconductor component according to claim 27, wherein the at least two semiconductor regions are arranged laterally next to one another.

29. The semiconductor component according to claim 27, wherein the at least two semiconductor regions are arranged vertically on top of one another.

30. The semiconductor component according to claim 25, wherein an electric contact provided for the active area at least partially overlaps the junction termination.

31. The semiconductor component according to claim 21, wherein the junction termination is configured as a field ring structure.

32. The semiconductor component according to claim 21, wherein the junction termination is grown epitaxially onto the surface of the semiconductor region.

33. The semiconductor component according to claim 21, wherein the junction termination is produced by ion implantation.

34. The semiconductor component according to claim 21, wherein the junction termination is produced by diffusion.

35. The semiconductor component according to claim 21, further comprising a unipolar active area.

36. The semiconductor component according to claim 21, further comprising a bipolar active area.

* * * * *